(12) United States Patent
Konno

(10) Patent No.: US 8,368,387 B2
(45) Date of Patent: Feb. 5, 2013

(54) ACCELERATION SENSOR

(75) Inventor: Nobuaki Konno, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 357 days.

(21) Appl. No.: 12/920,682

(22) PCT Filed: Oct. 28, 2008

(86) PCT No.: PCT/JP2008/069522
§ 371 (c)(1),
(2), (4) Date: Sep. 2, 2010

(87) PCT Pub. No.: WO2009/125510
PCT Pub. Date: Oct. 15, 2009

(65) Prior Publication Data
US 2011/0031959 A1    Feb. 10, 2011

(30) Foreign Application Priority Data

Apr. 11, 2008  (JP) ................................. 2008-103406

(51) Int. Cl.
*G01P 15/00* (2006.01)
*G01P 15/08* (2006.01)
(52) U.S. Cl. .................. 324/162; 73/514.32; 73/514.18
(58) Field of Classification Search .................. None
See application file for complete search history.

(56) References Cited

U.S. PATENT DOCUMENTS

| 4,699,006 A | 10/1987 | Boxenhorn |
| 4,736,629 A | 4/1988 | Cole |
| 5,488,864 A * | 2/1996 | Stephan ..................... 73/514.32 |
| 6,082,197 A * | 7/2000 | Mizuno et al. ............. 73/514.36 |
| 6,955,086 B2 | 10/2005 | Yoshikawa et al. |
| 7,624,638 B2 | 12/2009 | Konno et al. |
| 2004/0025591 A1 | 2/2004 | Yoshikawa et al. |

FOREIGN PATENT DOCUMENTS

| JP | 5 133976 | 5/1993 |
| JP | 2008 139282 | 6/2008 |
| WO | 03 044539 | 5/2003 |

* cited by examiner

*Primary Examiner* — Minh N Tang
(74) *Attorney, Agent, or Firm* — Oblon, Spivak, McClelland, Maier & Neustadt, L.L.P.

(57) ABSTRACT

An acceleration sensor includes a substrate, first and second torsion beams, first and second detection frames, first and second detection electrodes, first and second link beams, and an inertial mass body. The first and second torsion beams are distorted around the first and second torsion axes. The first and second detection frames are rotated about the first and second torsion axes. The first and second detection electrodes detect an angle formed between the substrate and each of the first and second detection frames. The first link beam is on a first axis located at a position shifted from a position of the first torsion axis to one end side of the first detection frame along a direction crossing the first torsion axis. The second link beam is on a second axis located at a position shifted from a position of the second torsion axis in a direction identical to the direction of shift from the position of the first torsion axis.

7 Claims, 11 Drawing Sheets

ACCELERATION SENSOR

TECHNICAL FIELD

The present invention relates to an acceleration sensor, and for example to an electrostatic capacitance type acceleration sensor.

BACKGROUND ART

As one of the principles of a conventional acceleration sensor for detecting acceleration in the substrate thickness direction, there is a method for detecting a change in electrostatic capacitance in accordance with the acceleration. As an acceleration sensor based on this method, an acceleration sensor (an acceleration sensing motion converter) including, for example, a torsion beam (a deflecting part), an inertia mass body (a weight), a detection frame (an element), and a detection electrode (a sensing electrode) as main components has been known (see for example Japanese Patent Laying-Open No. 05-133976 (Patent Document 1)).

The acceleration sensor of Patent Document 1 has one detection frame having a surface facing a substrate. The inertia mass body is provided on one end part of the detection frame. The detection frame is supported on the substrate so as to be rotatable with the torsion beam as the axis of rotation. The detection electrode for detecting this rotational displacement is provided under the detection frame.

Further, an acceleration sensor having an inertia mass body disposed in the same plane as a detection frame, instead of being disposed on a detection frame, has been known (see for example International Publication WO 2003/044539 (Patent Document 2)). The acceleration sensor of Patent Document 2 includes a torsion beam, an inertia mass body (a mass body), a detection frame (a movable electrode), and detection electrodes (first and second fixed electrodes). The torsion beam is coupled to an anchor part supported by a substrate. One detection frame (movable electrode) is coupled to the torsion beam, and supported on the substrate so as to be rotatable with the torsion beam as the axis of rotation. Link beams are provided on one end part and the other end part of the detection frame, at positions a predetermined distance away from the center line of the detection frame. The inertia mass body (mass body) is coupled to the link beams. The inertia mass body is constituted to be movable in accordance with acceleration in the thickness direction of the silicon substrate.

When acceleration in the substrate thickness direction is applied to the acceleration sensor constituted as described above, inertia force in the substrate thickness direction acts on the inertia mass body. Since the inertia mass body is provided on the one end part, that is, at a position deviated from the axis of rotation in the substrate in-plane direction, this inertia force acts on the detection frame as a torque around the torsion beam. As a result, the detection frame is rotationally displaced. The distance between the detection frame and the detection electrode is changed by this rotational displacement, which causes electrostatic capacitance formed by the detection frame and the detection electrode to be changed. The acceleration is measured from this change in electrostatic capacitance.

Patent Document 1: Japanese Patent Laying-Open No. 05-133976

Patent Document 2: International Publication WO 2003/044539

DISCLOSURE OF THE INVENTION

Problems to be Solved by the Invention

Generally, each of the acceleration sensors of Patent Documents 1 and 2 described above is sealed into a package by performing molding using a resin material. If there is a difference in thermal characteristics of materials constituting the acceleration sensor and the resin material, the shape of the package is deformed due to thermal contraction of the respective materials or the like when molding is performed, causing warpage of the package. If warpage of the package occurs, the substrate supporting the acceleration sensor disposed inside the package may be warped. If warpage occurs in the substrate, an output of the acceleration sensor changes before and after the acceleration sensor is sealed into the package. Further, if the shape of the package is deformed over time, the output of the acceleration sensor also changes with time.

Therefore, one object of the present invention is to provide an acceleration sensor with accuracy improved by reducing influence due to warpage of a substrate.

Means for Solving the Problems

The acceleration sensor according to the present invention includes a substrate, a first torsion beam, a first detection frame, a second torsion beam, a second detection frame, first and second detection electrodes, a first link beam, a second link beam, and an inertia mass body. The first torsion beam can be distorted around a first torsion axis, and is supported by the substrate. The first detection frame is supported by the substrate via the first torsion beam so as to be rotatable about the first torsion axis. The second torsion beam can be distorted around a second torsion axis, and is supported by the substrate. The second detection frame is supported by the substrate via the second torsion beam so as to be rotatable about the second torsion axis. The first and second detection electrodes are formed on the substrate so as to face the first and second detection frames, respectively, and detect an angle formed between the substrate and each of the first and second detection frames on the basis of electrostatic capacitance. The first link beam is connected to the first detection frame on a first axis located at a position shifted from a position of the first torsion axis to one end side of the first detection frame along a direction crossing the first torsion axis. The second link beam is connected to the second detection frame on a second axis located at a position shifted from a position of the second torsion axis in a direction identical to the direction of shift from the position of the first torsion axis. The inertia mass body is supported above the substrate so as to be displaceable in a thickness direction of the substrate, by being linked with the first and second detection frames by the first and second link beams, respectively.

Effects of the Invention

According to the acceleration sensor of the present invention, the first link beam is connected to the first detection frame on a first axis located at a position shifted from a position of the first torsion axis to one end side of the first detection frame along a direction crossing the first torsion axis. On the other hand, the second link beam is connected to the second detection frame on a second axis located at a position shifted from a position of the second torsion axis in a direction identical to the direction of shift described above.

Therefore, if the substrate is warped, the first and second detection frames are rotationally displaced in the directions opposite to each other. As a result, increase/decrease of electrostatic capacitance of a capacitor formed by the first detection frame and the first detection electrode and increase/decrease of electrostatic capacitance of a capacitor formed by the second detection frame and the second detection electrode are displaced opposite to each other. Therefore, if the substrate is warped, displacement of the electrostatic capacitance of the capacitor formed by the first detection frame and the first detection electrode and displacement of the electrostatic capacitance of the capacitor formed by the second detection frame and the second detection electrode are mutually canceled.

Consequently, even when the substrate is warped, occurrence of an error output can be suppressed. Further, even when there is a change in the warpage of the substrate, it is possible to suppress the influence of an output error. Therefore, accuracy can be improved by reducing the influence due to the warpage of the substrate.

DESCRIPTION OF THE REFERENCE SIGNS

1: substrate, 2: inertia mass body, 3: insulating film, 5: actuation electrode, 10: first unit, 11: first torsion beam, 12: second torsion beam, 13: third torsion beam, 14: fourth torsion beam, 15: fifth torsion beam, 16: sixth torsion beam, 17: seventh torsion beam, 18: eighth torsion beam, 20: second unit, 21: first detection frame, 22: second detection frame, 23: third detection frame, 24: fourth detection frame, 25: fifth detection frame, 26: sixth detection frame, 27: seventh detection frame, 28: eighth detection frame, 30: third unit, 31: first link beam, 32: second link beam, 33: third link beam, 34: fourth link beam, 35: fifth link beam, 36: sixth link beam, 37: seventh link beam, 38: eighth link beam, 40: fourth unit, 41, 41a, 41b: first detection electrode, 42, 42a, 42b: second detection electrode, 43, 43a, 43b: third detection electrode, 44, 44a, 44b: fourth detection electrode, 45, 45a, 45b: fifth detection electrode, 46, 46a, 46b: sixth detection electrode, 47, 47a, 47b: seventh detection electrode, 48, 48a, 48b: eighth detection electrode, 50: fifth unit, 60: sixth unit, 70: seventh unit, 80: eighth unit, 91-98: anchor, 101: PSG film, 102: polysilicon film.

BEST MODES FOR CARRYING OUT THE INVENTION

In the following, embodiments according to the present invention will be described with reference to the drawings.

Embodiment 1

Firstly, a main constitution of an acceleration sensor according to the present embodiment will be explained.

Figure 1:
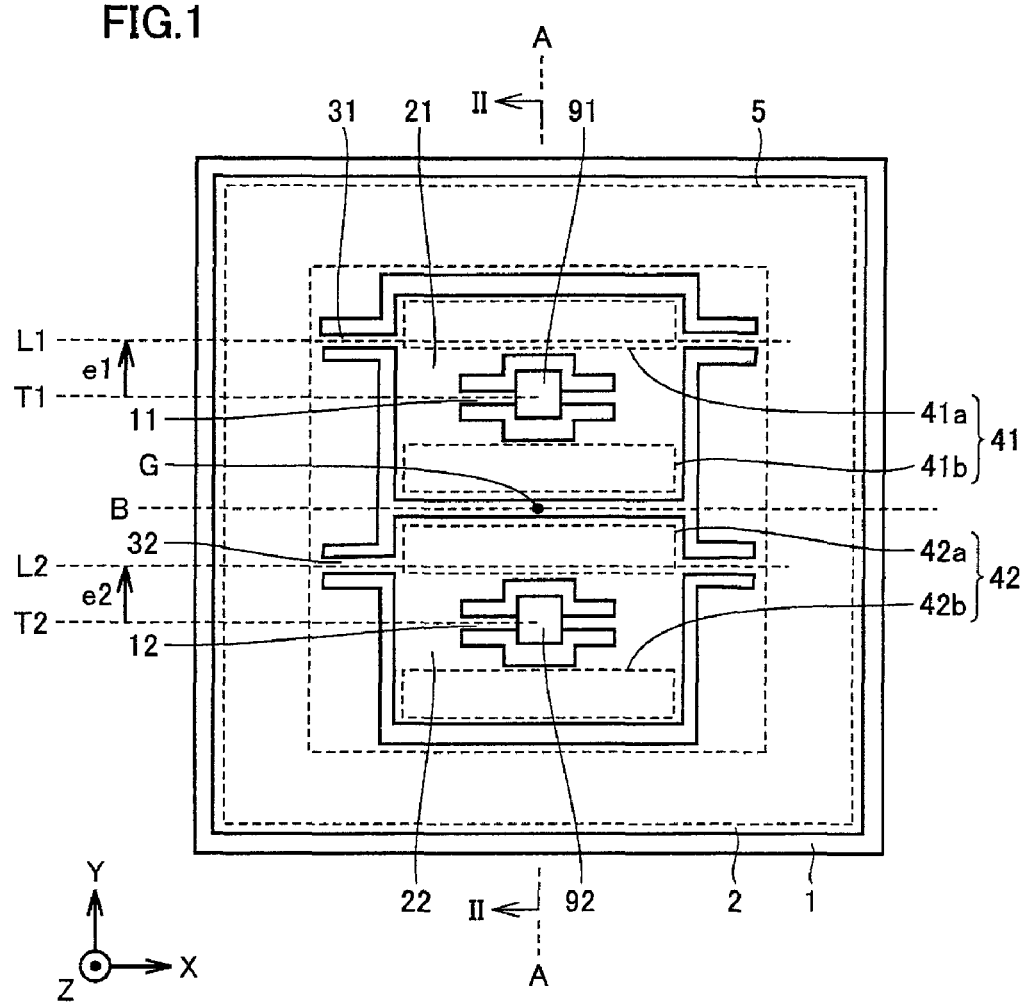
FIG. 1 is a top view schematically showing a constitution of an acceleration sensor according to Embodiment 1 of the present invention.
Figure 2:
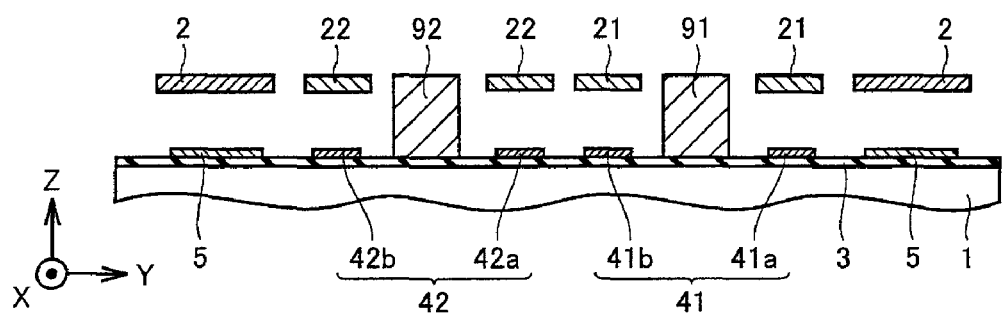
FIG. 2 is a schematic cross-sectional view along line II-II in FIG. 1.

FIG. 1 is a top view schematically showing a constitution of an acceleration sensor according to Embodiment 1 of the present invention. FIG. 2 is a schematic cross-sectional view along line II-II in FIG. 1. It is to be noted that the coordinate axes of the X axis, the Y axis and the Z axis are introduced for convenience of explanation. In FIG. 1, the X axis is an axis in which the right direction along the lateral direction is the positive direction, the Y axis is an axis in which the upper direction along the longitudinal direction is the positive direction, and the Z axis is an axis which is vertical to the paper surface and in which the upper direction is the positive direction. The direction of the Z axis coincides with the acceleration direction to be measured by the acceleration sensor according to the present embodiment.

Referring to FIGS. 1 and 2, the acceleration sensor according to the present embodiment mainly includes a substrate 1, first and second torsion beams 11 and 12, first and second detection frames 21 and 22, a plurality of detection electrodes, first and second link beams 31 and 32, an inertia mass body 2, and an actuation electrode 5.

For example, a silicon substrate can be used as substrate 1. Further, a polysilicon film can be used as a material for first and second torsion beams 11 and 12, first and second detection frames 21 and 22, first and second link beams 31 and 32, inertia mass body 2, the detection electrodes, and actuation electrode 5. It is preferred that the polysilicon film has low stress, and has no stress distribution in the thickness direction thereof.

First torsion beam 11 is supported by an anchor 91 provided to substrate 1 so as to be distortionable around a first torsion axis T1 along the X axis.

First detection frame 21 is supported by substrate 1 via first torsion beam 11 so as to be rotatable about first torsion axis T1. Further, at least a part of first detection frame 21 has conductivity.

Second torsion beam 12 is supported by an anchor 92 provided to substrate 1 so as to be distortionable around a second torsion axis T2 along the X axis.

Second detection frame 22 is supported by substrate 1 via second torsion beam 12 so as to be rotatable about second torsion axis T2. Further, at least a part of second detection frame 22 has conductivity.

The plurality of detection electrodes have a first detection electrode 41 and a second detection electrode 42. First and second detection electrodes 41 and 42 are formed on substrate 1 with an insulating film 3 interposed therebetween so as to face first and second detection frames 21 and 22, respectively, in order to enable an angle formed between substrate 1 and each of first and second detection frames 21 and 22 to be detected on the basis of electrostatic capacitance. It is to be noted that a silicon nitride film or a silicon oxide film having low stress is suitable as insulating film 3.

Actuation electrode 5 is formed on substrate 1 with insulating film 3 interposed therebetween so as to face inertia mass body 2, in order to enable inertia mass body 2 to be displaced on the basis of electrostatic force.

First link beam 31 is connected to first detection frame 21 on a first axis L1 which is located at a position shifted from a position of first torsion axis T1 to one end side of first detection frame 21 by an offset e1 along a direction crossing first torsion axis T1. It is to be noted that the "offset" described above refers to a value indicating a position thereof with a difference (distance) from a reference point. That is, the absolute value of offset e1 is a dimension between first torsion axis T1 and first link beam 31, and the direction of offset e1 is the direction crossing first torsion axis T1 and directed from first torsion axis T1 to first axis L1.

Second link beam 32 is connected to second detection frame 22 on a second axis L2 which is located at a position shifted in parallel from a position of second torsion axis T2 by an offset e2 in a direction identical to the direction of shift described above, that is, a direction identical to the direction of offset e1. That is, the absolute value of offset e2 is a dimension between second torsion axis T2 and second link beam 32, and the direction of offset e2 is identical to the direction of offset e1.

Preferably, first and second torsion beams 11 and 12 and first and second link beams 31 and 32 are disposed such that offsets e1 and e2 are equal.

Preferably, first and second torsion axes T1 and T2 are in parallel with each other. That is, first and second torsion beams 11 and 12 are disposed in parallel with each other, and first and second link beams 31 and 32 are disposed in parallel with each other.

Inertia mass body 2 is supported above substrate 1 so as to be displaceable in the thickness direction of substrate 1, by being connected to first and second detection frames 21 and 22 by first and second link beams 31 and 32, respectively.

Subsequently, details of constitution of the detection electrodes described above, and the principle of detecting the angle between substrate 1 and each of first and second detection frames 21 and 22 by the detection electrodes will be explained.

The plurality of detection electrodes have first detection electrode 41 facing first detection frame 21. First detection electrode 41 has first detection electrodes 41a and 41b so as to sandwich first torsion axis T1 therebetween. First detection electrode 41a is positioned on the outer peripheral side (upper side in FIG. 1) of the acceleration sensor, and first detection electrode 41b is positioned on the inner peripheral side (central side in FIG. 1) of the acceleration sensor. First detection electrodes 41a and 41b are provided so as to sandwich first torsion axis T1 therebetween.

When first detection frame 21 is rotated around first torsion beam 11, the rear surface (surface facing detection electrode 41) of first detection frame 21 approaches one of detection electrodes 41a and 41b and recedes from the other detection electrode. Thus, it is possible to detect an angle between first detection frame 21 and substrate 1 by detecting a difference between electrostatic capacitance formed by making first detection frame 21 face detection electrode 41a and electrostatic capacitance formed by making first detection frame 21 face detection electrode 41b.

The plurality of detection electrodes also have second detection electrode 42 facing second detection frame 22. Second detection electrode 42 has second detection electrodes 42a and 42b so as to sandwich second torsion axis T2 therebetween. Second detection electrode 42a is positioned on the inner peripheral side (central side in FIG. 1) of the acceleration sensor, and second detection electrode 42b is positioned on the outer peripheral side (lower side in FIG. 1) of the acceleration sensor. Second detection electrodes 42a and 42b are provided so as to sandwich second torsion axis T2 therebetween.

When second detection frame 22 is rotated around second torsion beam 12, the rear surface (surface facing detection electrode 42) of second detection frame 22 approaches one of second detection electrodes 42a and 42b and recedes from the other second detection electrode. Thus, it is possible to detect an angle between second detection frame 22 and substrate 1 by detecting a difference between electrostatic capacitance formed by making second detection frame 22 face second detection electrode 42a and electrostatic capacitance formed by making second detection frame 22 face second detection electrode 42b.

Preferably, the plane layout of the acceleration sensor has a constitution which is line symmetrical with respect to an axis B extending in the direction in parallel with first and second torsion axes T1 and T2, except for first and second link beams 31 and 32, and the center of gravity G of inertia mass body 2 is positioned on axis B.

Further, the plane layout of the acceleration sensor has a constitution which is line symmetrical with respect to an axis A extending in the direction crossing first and second torsion axes T1 and T2, and the center of gravity G of inertia mass body 2 is positioned on axis A.

Subsequently, a principle of measuring acceleration by the acceleration sensor according to the present embodiment will be explained.

Figure 3:
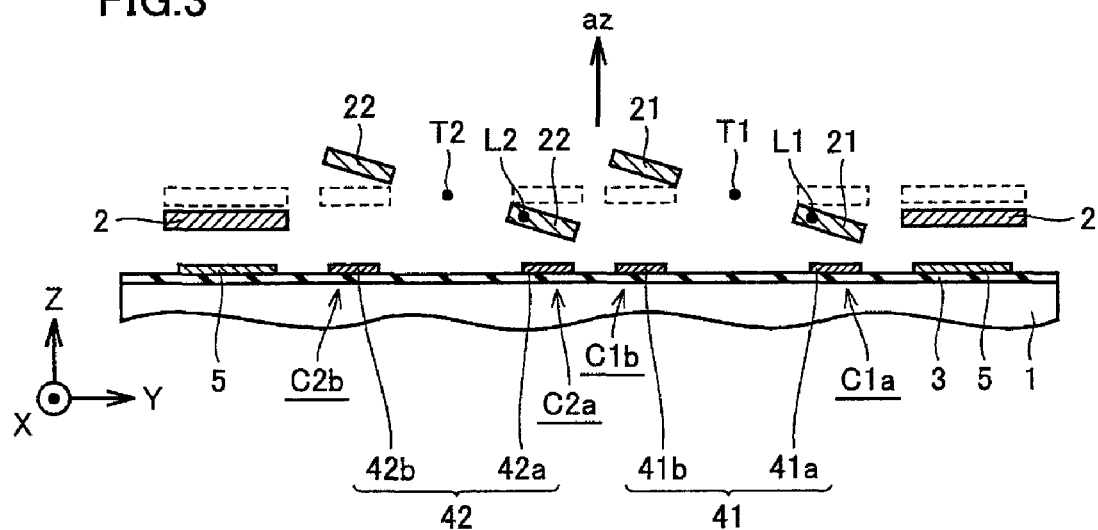
FIG. 3 is a cross-sectional view which schematically shows a state where acceleration is applied upward along the film thickness direction of the substrate to the acceleration sensor according to Embodiment 1 of the present invention.

FIG. 3 is a cross-sectional view which schematically shows a state where acceleration is applied upward along the film thickness direction of the substrate to the acceleration sensor according to Embodiment 1 of the present invention. The cross-sectional position in FIG. 3 is identical to that in FIG. 2. Further, in FIG. 3, anchors 91 and 92 are not shown for the sake of clarity.

Referring to FIG. 3, when acceleration az in the upward direction along the film thickness direction of the substrate, that is, in the positive direction (upward direction in the figure) of the Z axis, is applied to the acceleration sensor, inertia mass body 2 is displaced by the inertia force so as to be sunk in the negative direction (downward direction in the figure) of the Z axis, from an initial position (position shown by broken lines in the figure). First and second link beams 31 and 32 which are linked with inertia mass body 2 are also displaced integrally with the inertia mass body in the negative direction (downward direction in the figure) of the Z axis.

Due to the displacement of first link beam 31, first detection frame 21 receives force in the negative direction (downward direction in the figure) of the Z axis by a part of first axis L1. First axis L1 is located at the position shifted in parallel from the position of first torsion axis T1 by offset e1, which causes torque about first axis L1 to act on first detection frame 21. As a result, first detection frame 21 is rotationally displaced.

Further, due to the displacement of second link beam 32, second detection frame 22 receives force in the negative direction (downward direction in the figure) of the Z axis by a part of second axis L2. Second axis L2 is located at the position shifted in parallel from the position of second torsion axis T2 by offset e2, which causes torque about second axis L2 to act on second detection frame 22. As a result, second detection frame 22 is rotationally displaced.

Since offsets e1 and e2 are directed in the same direction, first detection frame 21 and second detection frame 22 are rotated in the same direction. That is, first and second detection frames 21 and 22 are rotationally displaced in such a manner that the upper surface of first detection frame 21 is directed toward one end side (right-hand side in FIG. 3) of the acceleration sensor, and the upper surface of second detection frame 22 is also directed toward one end side (right-hand side in FIG. 3) of the acceleration sensor.

In accordance with this rotational displacement, electrostatic capacitance $C_{1a}$ of a capacitor C1a formed by first detection frame 21 and detection electrode 41a is increased, and electrostatic capacitance $C_{1b}$ of a capacitor C1b formed by first detection frame 21 and detection electrode 41b is decreased. Further, electrostatic capacitance $C_{2a}$ of a capacitor C2a formed by second detection frame 22 and detection electrode 42a is increased, and electrostatic capacitance $C_{2b}$ of a capacitor C2b formed by second detection frame 22 and detection electrode 42b is decreased.

Figure 4:
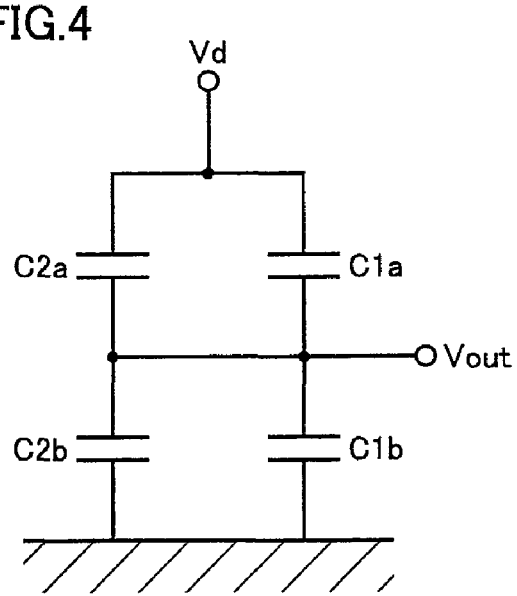
FIG. 4 is a circuit diagram explaining electrical connection between capacitors formed by first and second detection frames and detection electrodes of the acceleration sensor according to Embodiment 1 of the present invention.

FIG. 4 is a circuit diagram explaining electrical connection between the capacitors formed by the first and second detection frames and the detection electrodes of the acceleration sensor according to Embodiment 1 of the present invention. Referring to FIG. 4, capacitors C1a and C2a are connected in parallel, and capacitors C1b and C2b are connected in parallel. Then, the two parallel connection parts are further connected in series. A constant potential $V_d$ is applied to the end part on the side of capacitors C1a and C2a of the circuit formed in this way, and the end part on the side of capacitors C1b and C2b is grounded. The above described series connection part is provided with a terminal, whose output potential $V_{out}$ can be measured. Output potential $V_{out}$ takes a value obtained from the following formula:

$$V_{out} = \frac{C_{1a} + C_{2a}}{(C_{1a} + C_{2a}) + (C_{1b} + C_{2b})} V_d \qquad \text{formula (1)}$$

Since potential $V_d$ is a constant value, acceleration az in the Z axis direction can be sensed by measuring output potential $V_{out}$. If acceleration is 0, that is, there is no displacement, $V_{out}$ can be represented as $V_{out}=V_d/2$, because $C_{1a}=C_{2a}=C_{1b}=C_{2b}$.

Further, electrostatic force pulling inertia mass body 2 toward substrate 1 can be generated by applying a voltage to between actuation electrode 5 and inertia mass body 2. That is, inertia mass body 2 can be electrostatically driven in the film thickness direction of substrate 1. This electrostatic drive can cause displacement similar to the displacement of inertia mass body 2 in a case where acceleration az in the film thickness direction of substrate 1 is applied to the acceleration sensor. Therefore, the acceleration sensor can have a function of self-diagnosing whether the sensor is broken down without actually applying acceleration az to the acceleration sensor.

Next, a state where substrate 1 is warped in the acceleration sensor according to the present embodiment will be explained.

Figure 5:
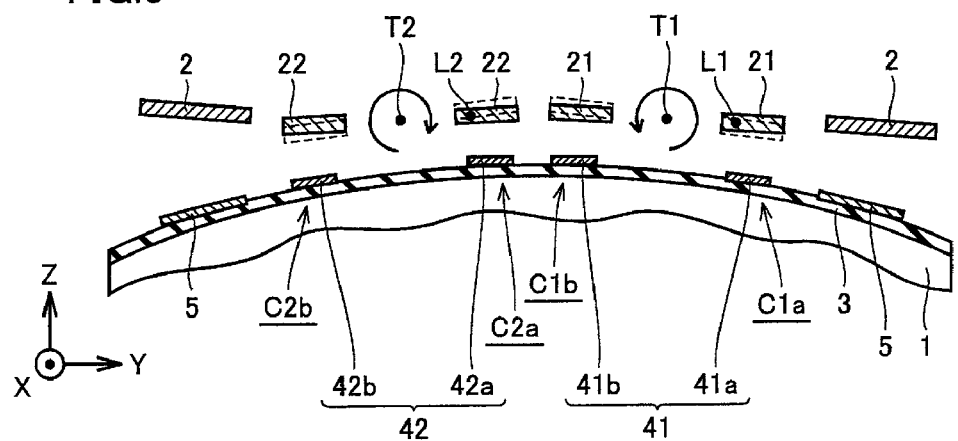
FIG. 5 is a cross-sectional view which schematically shows a state where the substrate is warped in a convex shape in the acceleration sensor according to Embodiment 1 of the present invention.

FIG. 5 is a cross-sectional view which schematically shows a state where substrate 1 is warped in a convex shape in the acceleration sensor according to Embodiment 1 of the present invention. The cross-sectional position in FIG. 5 is identical to that in FIG. 2. Further, in FIG. 5, anchors 91 and 92 are not shown for the sake of clarity.

Referring to FIG. 5, in a case where only first and second detection frames 21 and 22 are disposed and first and second link beams 31 and 32 are not formed, if substrate 1 is warped in a convex shape, first and second detection frames 21 and 22 are positioned perpendicular to anchors 91 and 92 (positions shown by dotted lines in FIG. 5). In the present embodiment, inertia mass body 2 is connected to first and second detection frames 21 and 22, via first and second link beams 31 and 32 positioned on first and second axes L1 and L2 located at positions shifted from positions of first and second torsion axes T1 and T2 in the same direction. If substrate 1 is warped in a convex shape in this arrangement, first and second detection frames 21 and 22 are moved in directions reducing a distance between facing end parts in first and second link beams 31 and 32 (directions indicated by arrows in FIG. 5). As a result, as shown in FIG. 5, first and second detection frames 21 and 22 are rotationally displaced in such a manner that the upper surface of first detection frame 21 is directed toward one end side (right-hand side in FIG. 5) of the acceleration sensor from the position shown by the dotted lines in FIG. 5, and the upper surface of second detection frame 22 is directed toward the other end side (left-hand side in FIG. 5) of the acceleration sensor from the position shown by the dotted lines in FIG. 5.

In accordance with the warpage of substrate 1 and the rotation of first and second detection frames 21 and 22, electrostatic capacitance $C_{1a}$ of capacitor C1$a$ formed by first detection frame 21 and first detection electrode 41$a$ is decreased, and electrostatic capacitance $C_{1b}$ of capacitor C1$b$ formed by first detection frame 21 and first detection electrode 41$b$ is increased. Further, electrostatic capacitance $C_{2a}$ of capacitor C2$a$ formed by second detection frame 22 and second detection electrode 42$a$ is increased, and electrostatic capacitance $C_{2b}$ of capacitor C2$b$ formed by second detection frame 22 and second detection electrode 42$b$ is decreased.

Referring to formula (1), when the above described changes in the electrostatic capacitance are caused, the increased displacement and the decreased displacement are mutually canceled, and thus $C_{1a}+C_{2a}=C_{1b}+C_{2b}$ is satisfied. Therefore, if acceleration is 0, $V_{out}$ can be represented as $V_{out}=V_d/2$, and the influence of the warpage of substrate 1 is suppressed.

Figure 6:
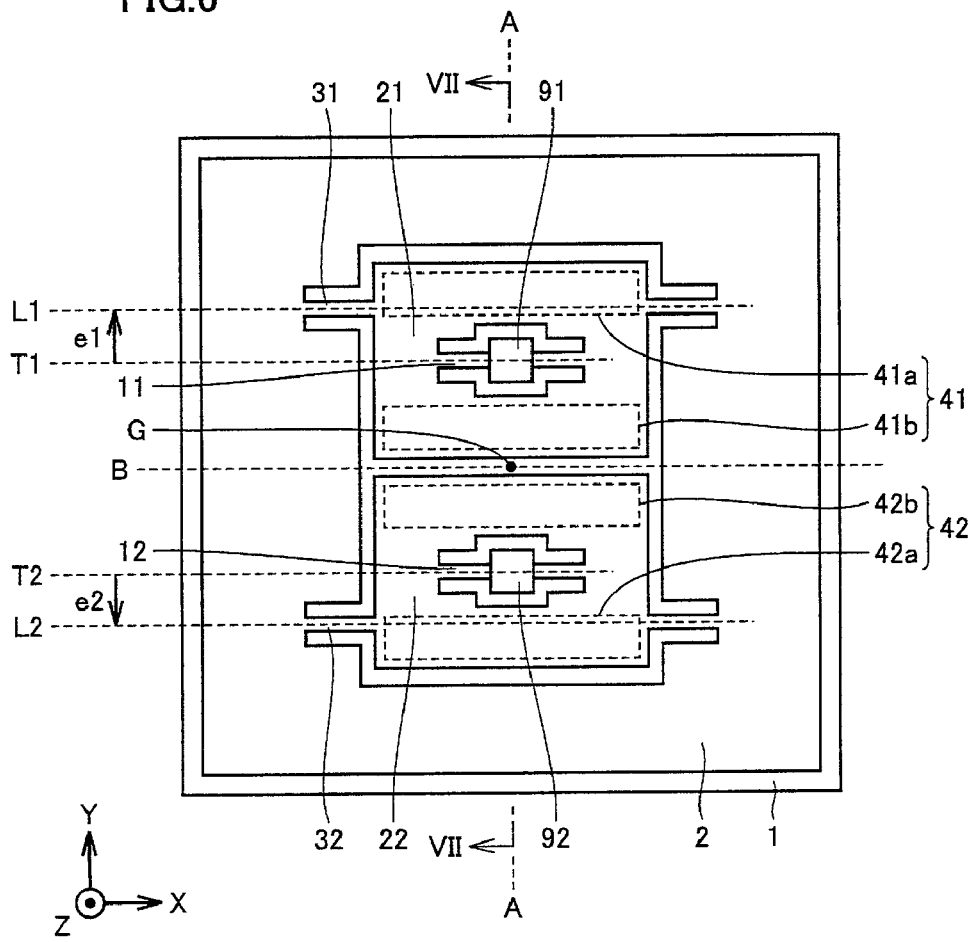
FIG. 6 is a top view schematically showing a constitution of an acceleration sensor according to a comparative example.
Figure 7:
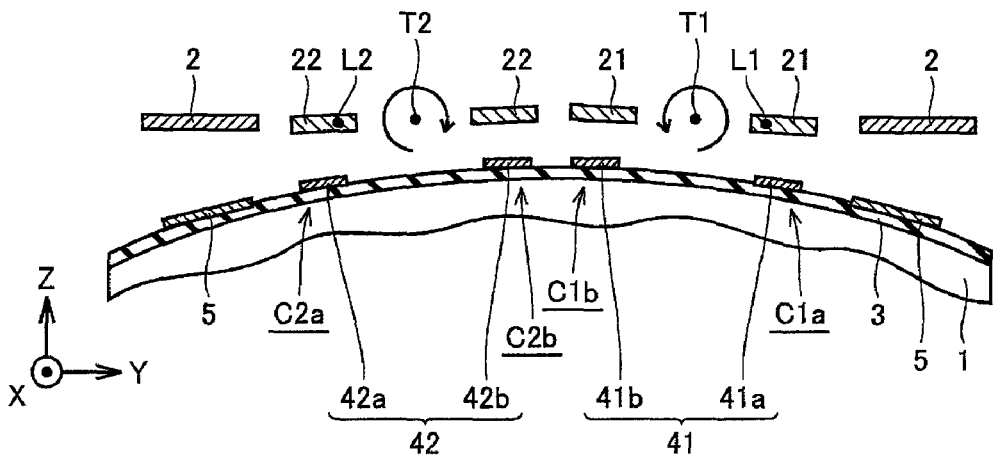
FIG. 7 is a cross-sectional view which schematically shows a state where the substrate is warped in a convex shape in the acceleration sensor according to the comparative example.

Here, an acceleration sensor according to a comparative example including first and second link beams 31 and 32 positioned on first and second axes L1 and L2 located at positions shifted from positions of first and second torsion axes T1 and T2 in directions opposite to each other will be explained. FIG. 6 is a top view schematically showing a constitution of an acceleration sensor according to a comparative example. FIG. 7 is a cross-sectional view which schematically shows a state where substrate 1 is warped in a convex shape in the acceleration sensor according to the comparative example. The cross-sectional position in FIG. 7 is identical to that in FIG. 2. Further, in FIG. 7, anchors 91 and 92 are not shown for the sake of clarity.

Referring to FIG. 7, if substrate 1 is warped in a convex shape, first and second detection frames 21 and 22 in the acceleration sensor according to the comparative example are moved in substantially the same manner. However, since first and second axes L1 and L2 are located at positions shifted from the positions of first and second torsion axes T1 and T2 in different directions, second detection electrodes 42$a$ and 42$b$ are disposed in an opposite manner, as shown in FIG. 7.

In accordance with the warpage of substrate 1 and the rotation of first and second detection frames 21 and 22, electrostatic capacitance $C_{1a}$ of capacitor C1$a$ formed by first detection frame 21 and detection electrode 41$a$ is decreased, and electrostatic capacitance $C_{1b}$ of capacitor C1$b$ formed by first detection frame 21 and detection electrode 41$b$ is increased. However, electrostatic capacitance $C_{2a}$ of capacitor C2$a$ formed by second detection frame 22 and detection electrode 42$a$ is decreased, and electrostatic capacitance $C_{2b}$ of capacitor C2$b$ formed by second detection frame 22 and detection electrode 42$b$ is increased.

Referring to formula (1), when the above described changes in the electrostatic capacitance are caused, $C_{1a}+C_{2a}=C_{1b}+C_{2b}$ is not satisfied. Therefore, if acceleration is 0, the influence of the warpage of substrate 1 is not suppressed.

It is to be noted that, also in an acceleration sensor including one detection frame, only one electrostatic capacitance can be measured, and thus the influence of the warpage of substrate 1 is not suppressed.

Although the above explanation has been given of a case where substrate 1 is warped in a convex shape, a similar effect is caused in a case where substrate 1 is warped in a concave shape, which merely results in opposite rotational displacement.

Subsequently, a method for manufacturing the acceleration sensor according to the present embodiment will be explained. FIGS. 8 to 12 are schematic cross-sectional views which sequentially show first to fifth steps of a method for manufacturing the acceleration sensor according to Embodiment 1 of the present invention, and whose cross-sectional positions correspond to the cross-sectional position in FIG. 2.

Figure 8:
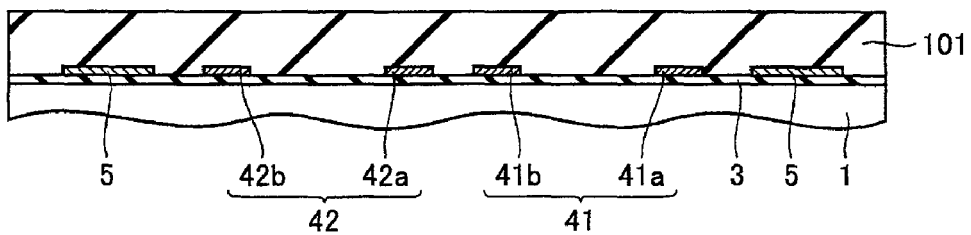
FIG. 8 is a schematic cross-sectional view which shows a first step of a method for manufacturing the acceleration sensor according to Embodiment 1 of the present invention, and whose cross-sectional position corresponds to the cross-sectional position in FIG. 2.

Referring to FIG. 8, insulating film 3 is deposited on substrate 1 made of silicon by the LPCVD (Low Pressure Chemical Vapor Deposition) method. As insulating film 3, a silicon nitride film, a silicon film, or the like having low stress is suitable. On insulating film 3, an electroconductive film made of, for example, polysilicon is deposited by the LPCVD method. Subsequently, the electroconductive film is patterned so that the plurality of detection electrodes and actuation electrode 5 are formed. Then, a PSG (Phosphosilicate Glass) film 101 is deposited on the whole surface of substrate 1.

Figure 9:
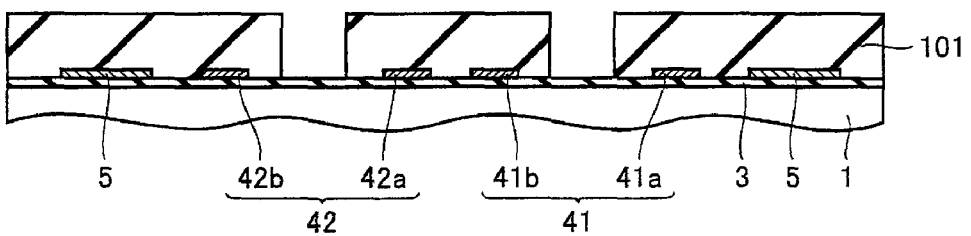
FIG. 9 is a schematic cross-sectional view which shows a second step of the method for manufacturing the acceleration sensor according to Embodiment 1 of the present invention, and whose cross-sectional position corresponds to the cross-sectional position in FIG. 2.

Referring mainly to FIG. 9, a part of PSG film 101 in which anchors 91 and 92 (see FIG. 2) are to be formed is selectively removed.

Figure 10:
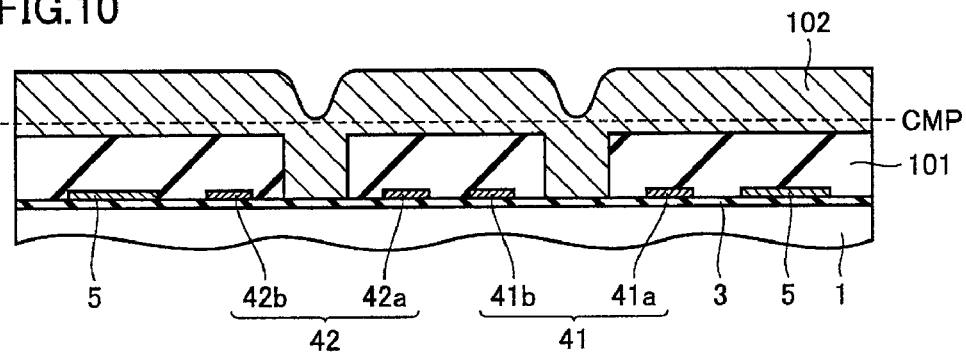
FIG. 10 is a schematic cross-sectional view which shows a third step of the method for manufacturing the acceleration sensor according to Embodiment 1 of the present invention, and whose cross-sectional position corresponds to the cross-sectional position in FIG. 2.

Referring to FIG. 10, a polysilicon film 102 is deposited on the whole surface of substrate 1. Subsequently, CMP (Chemical Mechanical Polishing) processing is performed to the surface of polysilicon film 102.

Figure 11:
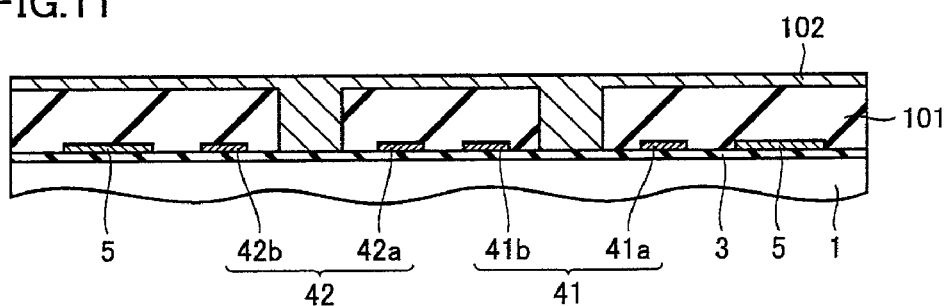
FIG. 11 is a schematic cross-sectional view which shows a fourth step of the method for manufacturing the acceleration sensor according to Embodiment 1 of the present invention, and whose cross-sectional position corresponds to the cross-sectional position in FIG. 2.

Referring to FIG. 11, the surface of polysilicon film 102 is planarized by the above described CMP processing.

Figure 12:
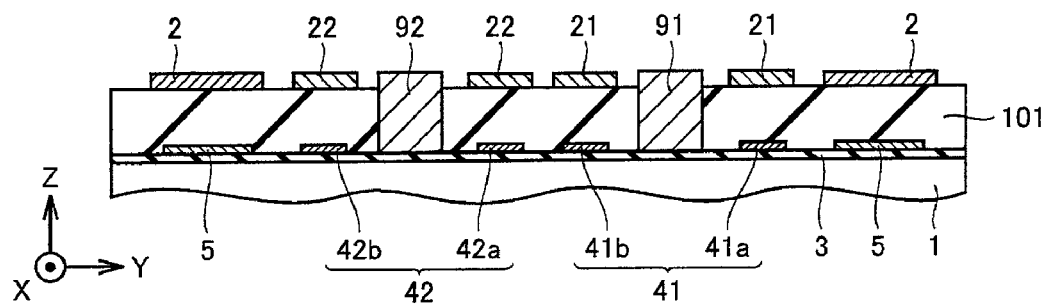
FIG. 12 is a schematic cross-sectional view which shows a fifth step of the method for manufacturing the acceleration sensor according to Embodiment 1 of the present invention, and whose cross-sectional position corresponds to the cross-sectional position in FIG. 2.

Referring to FIG. 12, selective etching is performed to the part of polysilicon film 102 above the upper surface of PSG film 101. Thereby, inertia mass body 2, first and second link beams 31 and 32, first and second detection frames 21 and 22, first and second torsion beams 11 and 12, and anchors 91 and 92 are collectively formed. Thereafter, PSG film 101 is removed by etching, and the acceleration sensor according to the present embodiment shown in FIGS. 1 and 2 is obtained.

As described above, according to the present embodiment, as shown in FIG. 1, the acceleration sensor has a plane layout in which offsets e1 and e2 are directed in the same direction. Thereby, when substrate 1 is warped as shown in FIG. 5, the changes in electrostatic capacitance between capacitors C1$a$ and C2$b$ and between capacitors C1$b$ and C2$a$ in the electrical circuit shown in FIG. 4 are substantially identical. As a result, the variation in the value shown by formula (1) is suppressed. That is, the influence of warpage of substrate 1 on output potential $V_{out}$ can be suppressed. Therefore, when acceleration az is detected on the basis of output potential $V_{out}$, it is possible to suppress a detection error from being caused by warpage of the substrate.

Further, as shown in FIGS. 11 and 12, inertia mass body 2 serving as a movable part, first and second link beams 31 and 32, first and second detection frames 21 and 22, and first and second torsion beams 11 and 12 are collectively formed from a film made of an identical material. Therefore, since there is no joint part of different materials in the movable part, no distortion is generated due to the difference in the thermal expansion coefficients of the different materials. Thereby, an acceleration sensor capable of suppressing temperature dependence can be achieved.

Preferably, in the present embodiment, offsets e1 and e2 shown in FIG. 1 are arranged to have absolute values equal to each other. Further, first and second torsion axes T1 and T2 shown in FIG. 1 are arranged to be in parallel with each other. Thereby, amounts of rotational displacement of first and second detection frames 21 and 22 are made equal to each other.

Thus, the electrostatic capacitances of capacitors C1a, C1b, C2a, and C2b shown in FIG. 4 are changed more accurately. This enables the error of the acceleration sensor to be further suppressed.

Embodiment 2

Figure 13:
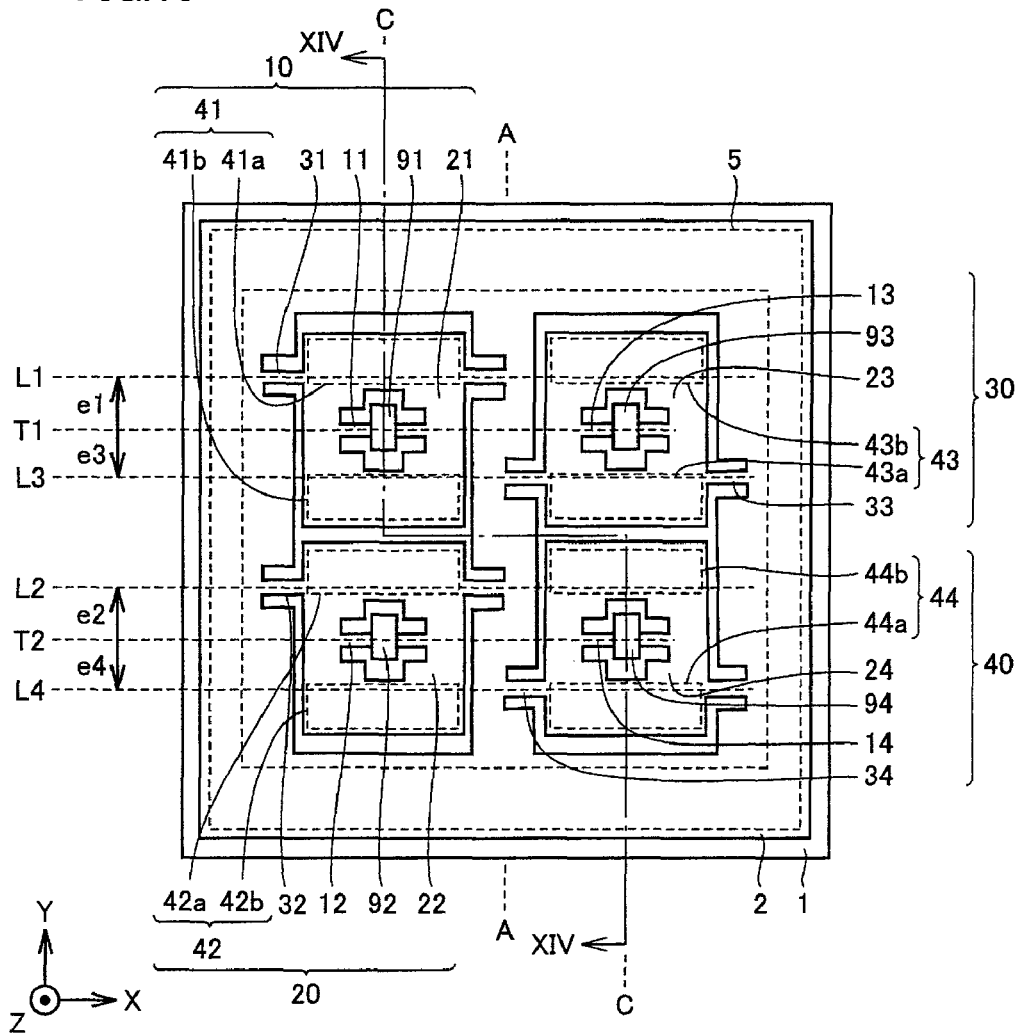
FIG. 13 is a top view schematically showing a constitution of an acceleration sensor according to Embodiment 2 of the present invention.

FIG. 13 is a top view schematically showing a constitution of an acceleration sensor according to Embodiment 2 of the present invention.

Referring to FIG. 13, the acceleration sensor according to the present embodiment has a constitution basically identical to that of the acceleration sensor according to Embodiment 1 shown in FIG. 1, and further includes third and fourth torsion beams 13 and 14, third and fourth detection frames 23 and 24, and third and fourth link beams 33 and 34, in addition to the constitution of the acceleration sensor of Embodiment 1. That is, the acceleration sensor according to the present embodiment includes a first unit 10, a second unit 20, a third unit 30, and a fourth unit 40. First to fourth units 10, 20, 30, and 40 have first to fourth torsion beams 11 to 14, first to fourth detection frames 21 to 24, first to fourth link beams 31 to 34, first to fourth detection electrodes 41 to 44, and anchors 91 to 94, respectively.

Third torsion beam 13 is supported by anchor 93 provided to substrate 1 so as to be distortionable around first torsion axis T1. That is, first torsion axis T1 serves as a third torsion axis about which third torsion beam 13 is distorted.

Third detection frame 23 is supported by substrate 1 via third torsion beam 13 so as to be rotatable about first torsion axis T1. Further, at least a part of third detection frame 23 has conductivity.

Fourth torsion beam 14 is supported by anchor 94 provided to substrate 1 so as to be distortionable around second torsion axis T2. That is, second torsion axis T2 serves as a fourth torsion axis about which fourth torsion beam 14 is distorted.

Fourth detection frame 24 is supported by substrate 1 via fourth torsion beam 14 so as to be rotatable about second torsion axis T2. Further, at least a part of fourth detection frame 24 has conductivity.

The plurality of detection electrodes further have a third detection electrode 43 and a fourth detection electrode 44. Third detection electrode 43 has third detection electrodes 43a and 43b facing third detection frame 23, in order to make it possible to detect an angle between third detection frame 23 and substrate 1 on the basis of electrostatic capacitance. Third detection electrodes 43a and 43b are formed on substrate 1 with insulating film 3 interposed therebetween so as to face third detection frame 23, respectively. Further, a plurality of fourth detection electrodes 44 have fourth detection electrodes 44a and 44b facing fourth detection frame 24, in order to make it possible to detect an angle between fourth detection frame 24 and substrate 1. Fourth detection electrodes 44a and 44b are formed on substrate 1 with insulating film 3 interposed therebetween so as to face fourth detection frame 24, respectively.

Third link beam 33 is connected to third detection frame 24 on a third axis L3. Third axis L3 is located at a position shifted in parallel from the position of first torsion axis T1 by an offset e3 in the negative direction of the Y axis. That is, the direction of offset e3 is opposite to a direction from first torsion axis T1 to first axis L1 (direction of offset e1). The absolute value of offset e3 is equal to that of offset e1.

Fourth link beam 34 is connected to fourth detection frame 24 on a fourth axis L4. Fourth axis L4 is located at a position shifted in parallel from the position of second torsion axis T2 by an offset e4 in the negative direction of the Y axis. That is, the direction of offset e4 is opposite to a direction from second torsion axis T2 to second axis L2 (direction of offset e2). The absolute value of offset e4 is equal to that of offset e2.

Inertia mass body 2 is supported above substrate 1 so as to be displaceable in the thickness direction of substrate 1, by being linked with first to fourth detection frames 21 to 24 via first to fourth link beams 31 to 34, respectively.

That is, third detection frame 23 is connected to anchor 93 by third torsion beam 13, and third link beam 33 is connected to inertia mass body 2 by third axis L3. Further, fourth detection frame 24 is connected to anchor 94 by fourth torsion beam 14, and fourth link beam 34 is connected to inertia mass body 2 by fourth axis L4.

Since the constitution other than this in the present embodiment is the same as the constitution of Embodiment 1 described above, the same components will be denoted by the same reference numerals and characters, and the explanation of the components will not be repeated.

Subsequently, a principle of measuring acceleration by the acceleration sensor according to the present embodiment will be explained.

Figure 14:
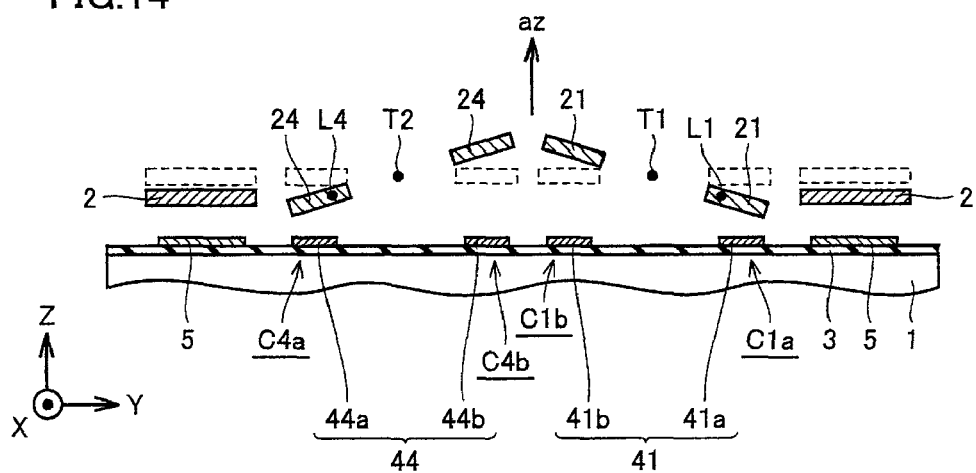
FIG. 14 is a cross-sectional view which schematically shows a state where acceleration is applied upward along the film thickness direction of the substrate to the acceleration sensor according to Embodiment 2 of the present invention.

FIG. 14 is a cross-sectional view which schematically shows a state where acceleration is applied upward along the film thickness direction of the substrate to the acceleration sensor according to Embodiment 2 of the present invention. FIG. 14 is a schematic cross-sectional view whose cross-sectional position is taken along line XIV-XIV in FIG. 13. Further, in FIG. 14, anchors 91 and 92 are not shown for the sake of clarity.

Referring to FIG. 14, when acceleration az in the upward direction along the film thickness direction of substrate 1, that is, in the positive direction (upward direction in the figure) of the Z axis, is applied to the acceleration sensor, inertia mass body 2 is displaced by the inertia force so as to be sunk in the negative direction (downward direction in the figure) of the Z axis, from an initial position (position shown by broken lines in the figure). First and second link beams 31 and 32 which are linked with inertia mass body 2 are also displaced integrally with the inertia mass body in the negative direction (downward direction in the figure) of the Z axis.

Due to the displacement of first link beam 31, first detection frame 21 receives force in the negative direction (downward direction in the figure) of the Z axis by a part of first axis L1. First axis L1 is located at the position shifted in parallel from the position of first torsion axis T1 by offset e1, which causes torque to act on first detection frame 21. As a result, first detection frame 21 is rotationally displaced.

Further, due to the displacement of fourth link beam 34, fourth detection frame 24 receives force in the negative direction (downward direction in the figure) of the Z axis by a part of fourth axis L4. Fourth axis L4 is located at the position shifted in parallel from the position of second torsion axis T2 by offset e4, which causes torque to act on fourth detection frame 24. As a result, fourth detection frame 24 is rotationally displaced.

Since offsets e1 and e4 are directed in opposite directions, first detection frame 21 and fourth detection frame 24 are rotated reversely to each other. That is, first and fourth detection frames 21 and 24 are rotationally displaced in such a manner that the upper surface of first detection frame 21 is directed toward one end side (right-hand side in FIG. 14) of the acceleration sensor, and the upper surface of fourth detection frame 24 is directed toward the other end (central) side (left-hand side in FIG. 14) of the acceleration sensor.

In accordance with this rotational displacement, electrostatic capacitance $C_{1a}$ of capacitor C1a formed by first detection frame 21 and detection electrode 41a is increased, and electrostatic capacitance $C_{4b}$ of a capacitor C4b formed by fourth detection frame 24 and fourth detection electrode 44b is decreased. Further, electrostatic capacitance $C_{4a}$ of a capacitor C4a formed by fourth detection frame 24 and fourth detection electrode 44a is increased, and electrostatic capacitance $C_{2b}$ of capacitor C2b formed by fourth detection frame 24 and fourth detection electrode 44b is decreased.

Since potential $V_d$ is a constant value as can be seen from formula (1) described above, the displacement of inertia mass body 2 in the thickness direction of substrate 1 can be detected by measuring output potential $V_{out}$, and acceleration az in the Z axis direction can be sensed as a result of the detection.

It is to be noted that acceleration az can also be sensed using first detection frame 21 and second detection frame 22, as in Embodiment 1. Further, acceleration az can also be sensed using the third detection frame and the fourth detection frame.

Next, a detection error caused when angular acceleration is applied to the acceleration sensor according to the present embodiment will be explained.

Figure 15:
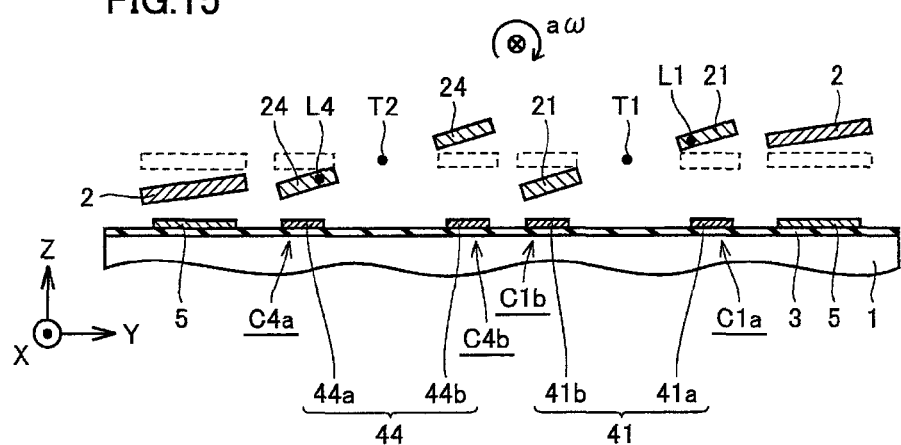
FIG. 15 is a cross-sectional view which schematically shows a state where angular acceleration around the X axis is applied to the acceleration sensor according to Embodiment 2 of the present invention.

FIG. 15 is a cross-sectional view which schematically shows a state where angular acceleration around the X axis is applied to the acceleration sensor according to Embodiment 2 of the present invention. The cross-sectional position in FIG. 15 is identical to that in FIG. 14. Further, in FIG. 15, anchors 91 and 92 and inertia mass body 2 in the center are not shown for the sake of clarity.

Referring to FIG. 15, when inertia mass body 2 receives negative angular acceleration aω in the X axis direction, inertia mass body 2 is inclined by being rotationally displaced by the moment of inertia thereof in a direction opposite to the direction of angular acceleration aω, from an initial position (position shown by broken lines in the figure). In accordance with the inclination of inertia mass body 2, first detection frame 21 is raised by the part of axis L1 of first link beam 31 so as to be rotated about first torsion axis T1, while fourth detection frame 24 is pressed down by the part of fourth axis L4 of fourth link beam 34 so as to be rotated about second torsion axis T2.

In accordance with the rotation of first and fourth detection frames 21 and 24, electrostatic capacitance $C_{1a}$ of capacitor C1a formed by first detection frame 21 and detection electrode 41a is decreased, and electrostatic capacitance $C_{1b}$ of capacitor C1b formed by first detection frame 21 and detection electrode 41b is increased. Further, electrostatic capacitance $C_{4a}$ of capacitor C4a formed by fourth detection frame 24 and detection electrode 44a is increased, and electrostatic capacitance $C_{4b}$ of capacitor C4b formed by fourth detection frame 24 and detection electrode 44b is decreased.

Figure 16:
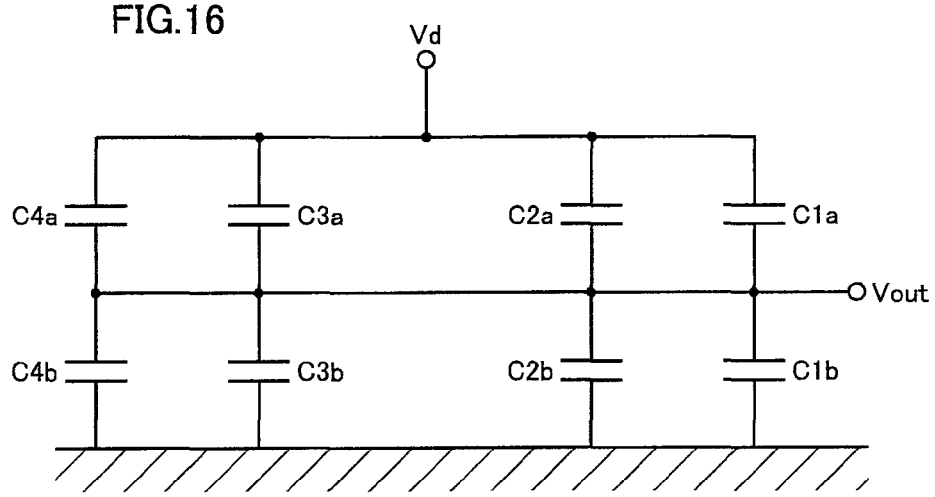
FIG. 16 is a circuit diagram explaining electrical connection between capacitors formed by first, second, third, and fourth detection frames and first, second, third, and fourth detection electrodes of the acceleration sensor according to Embodiment 2 of the present invention.

FIG. 16 is a circuit diagram explaining electrical connection between capacitors formed by the first, second, third, and fourth detection frames and the first, second, third, and fourth detection electrodes of the acceleration sensor according to Embodiment 2 of the present invention.

Referring to FIG. 16, capacitors C1a, C2a, C3a, and C4a are connected in parallel, and capacitors C1b, C2b, C3b, and C4b are connected in parallel. Then, the two parallel connection parts are further connected in series. Constant potential $V_d$ is applied to the end part on the side of capacitors C1a, C2a, C3a, and C4a of the circuit formed in this way, and the end part on the side of capacitors C1b, C2b, C3b, and C4b is grounded. The above described series connection part is provided with a terminal, whose output potential $V_{out}$ can be measured. Output potential $V_{out}$ takes a value obtained from the following formula:

$$V_{out} = \frac{C_{1a} + C_{2a} + C_{3a} + C_{4a}}{(C_{1a} + C_{2a} + C_{3a} + C_{4a}) + (C_{1b} + C_{2b} + C_{3b} + C_{4b})} V_d \quad \text{formula (2)}$$

Since potential $V_d$ is a constant value, acceleration az in the Z axis direction can be sensed by measuring output potential $V_{out}$. If acceleration is 0, that is, there is no displacement, $V_{out}$ can be represented as $V_{out}=V_d/2$, because C1a=C2a=C3a=C4a=C1b=C2b=C3b=C4b.

Referring to formula (2), when the above described changes in the electrostatic capacitance are caused, the decrease of electrostatic capacitance $C_{1a}$ and the increase of $C_{4a}$ are mutually canceled, and the increase of $C_{1b}$ and the decrease of $C_{4b}$ are mutually canceled. For this reason, the influence of angular acceleration aω on output potential $V_{out}$ is suppressed.

Next, a detection error caused when angular velocity is applied to the acceleration sensor according to the present embodiment will be explained.

Figure 17:
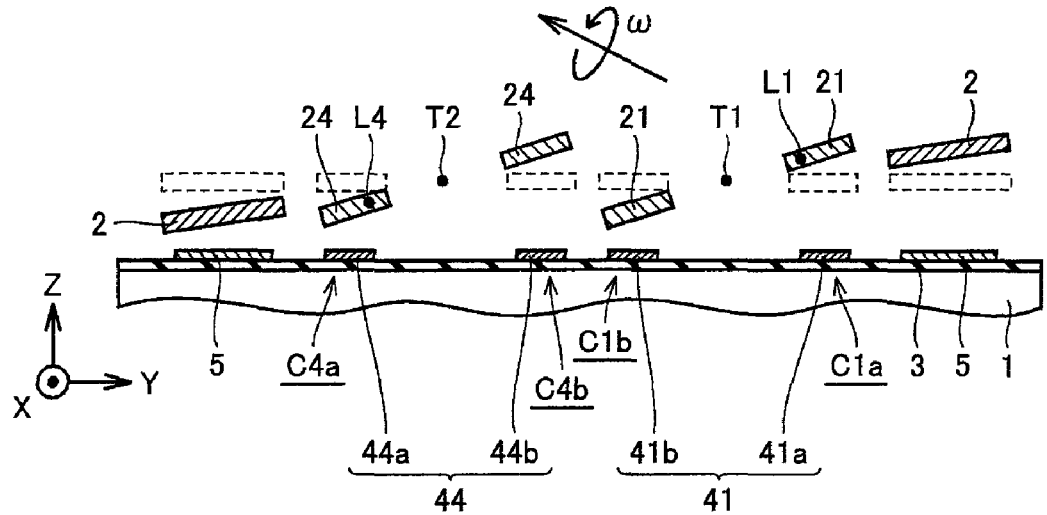
FIG. 17 is a cross-sectional view which schematically shows a state where angular velocity is applied to an axis slightly inclined from the Y axis in the acceleration sensor according to Embodiment 2 of the present invention.

FIG. 17 is a cross-sectional view which schematically shows a state where angular velocity is applied to an axis slightly inclined from the Y axis in the acceleration sensor according to Embodiment 2 of the present invention. The cross-sectional position in FIG. 17 is identical to that in FIG. 14. Further, in FIG. 17, anchors 91 and 92 and inertia mass body 2 in the center are not shown for the sake of clarity.

Referring to FIG. 17, centrifugal force associated with rotation of angular velocity ω acts on inertia mass body 2. Thereby, inertia mass body 2 is rotationally displaced from the initial position (position shown by broken lines in the figure) in a direction in which the end of inertia mass body 2 is away from the axis of rotation of angular velocity ω, so that inertia mass body 2 is inclined.

The inclination of inertia mass body 2 is the same as that of the above described case where angular acceleration aω is applied. For this reason, the influence of angular velocity ω on output potential $V_{out}$ is also suppressed on the basis of the same principle.

Next, a detection error caused when acceleration along another axis is applied to the acceleration sensor according to the present embodiment will be explained, including the influence of gravity.

Figure 18:
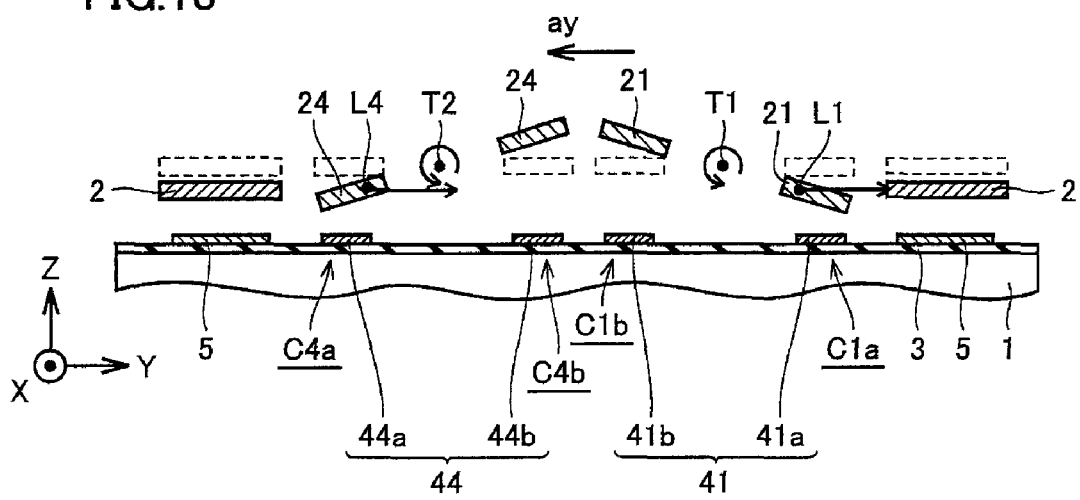
FIG. 18 is a cross-sectional view which schematically shows a state where acceleration in the Y axis direction is applied to the acceleration sensor according to Embodiment 2 of the present invention.

FIG. 18 is a cross-sectional view which schematically shows a state where acceleration in the Y axis direction is applied to the acceleration sensor according to Embodiment 2 of the present invention. The cross-sectional position in FIG. 18 is identical to that in FIG. 14. Further, in FIG. 18, anchors 91 and 92 and inertia mass body 2 in the center are not shown for the sake of clarity.

Referring to FIG. 18, negative force in the Z axis direction acts as gravity on inertia mass body 2, so that inertia mass body 2 is in a state of being sunk downward (in the negative direction of the Z axis in the figure) from the initial position (position shown by broken lines in the figure).

In this state, when acceleration ay is applied to the acceleration sensor in the negative direction of the Y axis, inertia force in the positive direction of the Y axis is applied to inertia mass body 2. This inertia force is transmitted to first and fourth detection frames 21 and 24 by the parts on first and fourth axes L1 and L4 of first and fourth link beams 31 and 34, respectively.

The height of first axis L1 from substrate 1 is made smaller than that of first torsion axis T1 due to the influence of gravity. For this reason, the above described force (indicated by the arrow in FIG. 18) transmitted to the part of first axis L1 acts on first detection frame 21 as torque around first torsion axis T1.

Further, the height of axis L4 from substrate 1 is made smaller than that of second torsion axis T2 due to the influence of gravity. For this reason, the above described force transmitted to the part of axis L4 acts on fourth detection frame 24 as torque around second torsion axis T2.

Here, both the above described torques around first and second torsion axes T1 and T2 have action points below first and second torsion axes T1 and T2. Further, both of the forces acting on the action points are directed in the positive direction of the Y axis direction. As a result, rotational displacement of first detection frame 21 and rotational displacement of fourth detection frame 24 are directed in the same direction.

Due to the influence of the rotational displacements, electrostatic capacitance $C_{1a}$ of capacitor C1a formed by first detection frame 21 and detection electrode 41a is decreased, and electrostatic capacitance $C_{1b}$ of capacitor C1b formed by first detection frame 21 and detection electrode 41b is increased. Further, electrostatic capacitance $C_{4a}$ of capacitor C4a formed by fourth detection frame 24 and detection electrode 44a is increased, and electrostatic capacitance $C_{4b}$ of capacitor C4b formed by fourth detection frame 24 and detection electrode 44b is decreased.

Referring to formula (2), when the changes in the above described electrostatic capacitances are caused, the decrease of electrostatic capacitance $C_{1a}$ and the increase of $C_{4a}$ are mutually canceled, and the increase of $C_{1b}$ and the decrease of $C_{4b}$ are mutually canceled. For this reason, the influence of acceleration ay in the Y axis direction on output potential $V_{out}$ measured for detecting acceleration in the Z axis direction is suppressed.

As has been described above, according to the present embodiment, a direction of shift from first and second torsion axes T1 and T2 to first and second axes L1 and L2 is opposite to a direction of shift from first and second torsion axes T1 and T2 to third and fourth axes L3 and L4. Thereby, a detection error due to angular acceleration, angular velocity, and acceleration along another axis can be suppressed. Therefore, even when substrate 1 is warped, output accuracy can be improved by first detection frame 21 and second detection frame 22, or third detection frame 23 and fourth detection frame 24, and even when angular acceleration, angular velocity, and acceleration along another axis are applied, output accuracy can be improved by first detection frame 21 and fourth detection frame 24, or second detection frame 22 and third detection frame 23.

Embodiment 3

Figure 19:
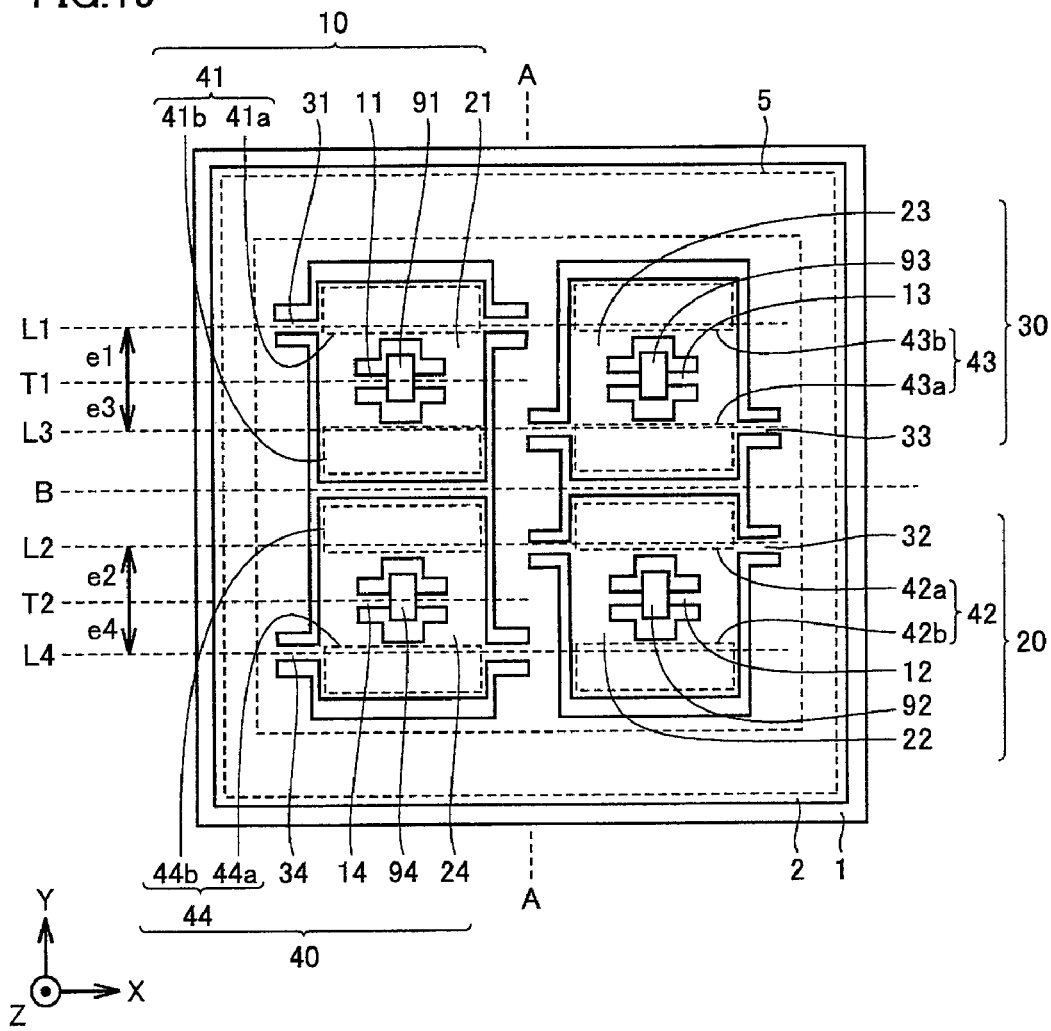
FIG. 19 is a top view schematically showing a constitution of an acceleration sensor according to Embodiment 3 of the present invention.

FIG. 19 is a top view schematically showing a constitution of an acceleration sensor according to Embodiment 3 of the present invention.

Referring to FIG. 19, the acceleration sensor according to the present embodiment has a constitution that is basically identical to that of Embodiment 2 shown in FIG. 13, and is different in that the locations of second detection frame 22, second link beam 32, second torsion beam 12, and anchor 92 (second unit 20) and the locations of fourth detection frame 24, fourth link beam 34, fourth torsion beam 14, and anchor 94 (fourth unit 40) are interchanged.

Therefore, the acceleration sensor in the present embodiment has a constitution which is axially symmetrical with respect to the X axis. In other words, in the acceleration sensor, first and second detection frames 21 and 22, first and second torsion beams 11 and 12, and first and second link beams 31 and 32 are disposed to be symmetrical with respect to an axis in parallel with first and second torsion axes T1 and T2.

Since the constitution other than this in the present embodiment is the same as the constitution of Embodiment 1 or 2 described above, the same components will be denoted by the same reference numerals and characters, and the explanation of the components will not be repeated.

According to the present embodiment, the positions of first and second link beams 31 and 32 are disposed to be axially symmetrical. Therefore, even when first and second detection frames 21 and 22 are inclined due to warpage or the like, inclination of inertia mass body 2 can be suppressed. That is, since inertia mass body 2 is likely to move only in parallel displacement in the out-of-plane direction, it is possible to detect output accurately, and to improve the accuracy of the self-diagnosis function by actuation electrode 5.

Embodiment 4

Figure 20:
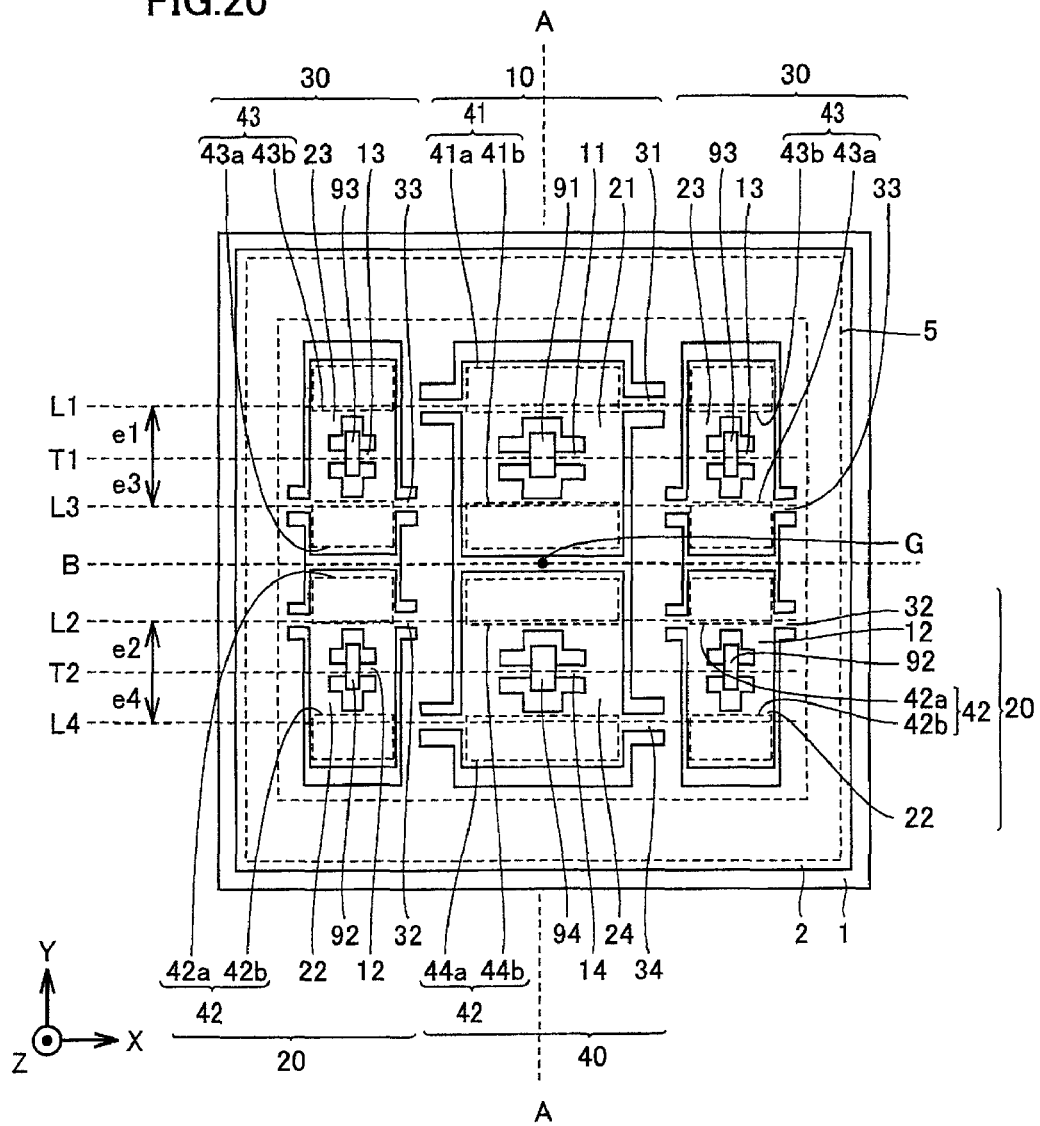
FIG. 20 is a top view schematically showing a constitution of an acceleration sensor according to Embodiment 4 of the present invention.

FIG. 20 is a top view schematically showing a constitution of an acceleration sensor according to Embodiment 4 of the present invention.

Referring to FIG. 20, the acceleration sensor according to the present embodiment has a constitution that is basically identical to that of Embodiment 3 shown in FIG. 19, and is further axially symmetrical with respect to the Y axis.

Specifically, the acceleration sensor includes one first unit 10, two second units, two third units 30, and one fourth unit 40. Fourth unit 40 is disposed so as to face first unit 10 with respect to axis B that passes through the center of gravity G and is in parallel with the X axis. Two second units 20 are disposed so as to sandwich fourth unit 40 and to face third units 30 with respect to axis B that passes through the center of gravity G and is in parallel with the X axis. Two third units 30 are disposed so as to sandwich first unit 10 and to face second units 20 with respect to axis B that passes through the center of gravity G and is in parallel with the X axis.

Further, first to fourth units 10, 20, 30, and 40 are disposed to be bilaterally symmetrical with respect to axis A that passes through the center of gravity G and is in parallel with the Y axis.

Since the constitution other than this in the present embodiment is the same as the constitution of Embodiment 3 described above, the same components will be denoted by the same reference numerals and characters, and the explanation of the components will not be repeated.

According to the present embodiment, first and second detection frames 21 and 22, first and second torsion beams 11 and 12, and first and second link beams 31 and 32 are disposed to be symmetrical with respect to an axis crossing first and second torsion axes T1 and T2 (axis A in the present embodiment). Thereby, the positions of first and second link beams 31 and 32 are alternately disposed to be axially symmetrical. Therefore, even when first and second detection frames 21 and 22 are inclined due to warpage of substrate 1 or the like, inclination of inertia mass body 2 can be further suppressed. That is, since inertia mass body 2 moves substantially only in parallel displacement in the out-of-plane direction, it is possible to detect output more accurately, and to further improve the accuracy of the self-diagnosis function by actuation electrode 5.

Embodiment 5

Figure 21:
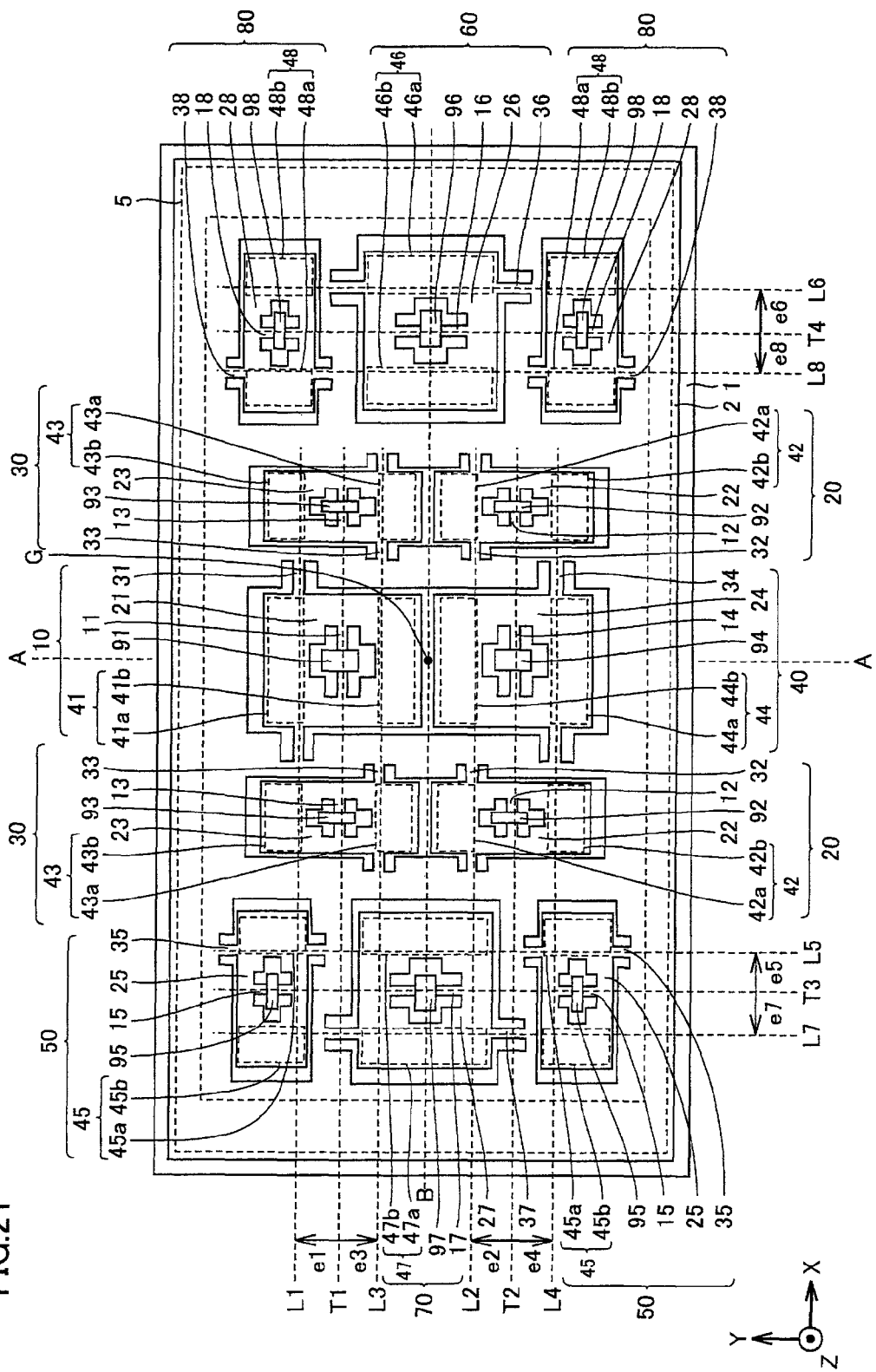
FIG. 21 is a top view schematically showing a constitution of an acceleration sensor according to Embodiment 5 of the present invention.

FIG. 21 is a top view schematically showing a constitution of an acceleration sensor according to Embodiment 5 of the present invention.

Referring to FIG. 21, the acceleration sensor according to the present embodiment has a constitution basically identical to that of Embodiment 4 shown in FIG. 20, and further includes fifth to eighth units 50, 60, 70, and 80 implemented by rotating first units 10 and second units 20 by 90 degrees with respect to the center of gravity G. That is, in the acceleration sensor according to the present embodiment, constitutions rotated by 90 degrees with respect to the center of gravity G are disposed to be completely axially symmetrical.

Fifth to eighth units 50, 60, 70, and 80 have fifth to eighth torsion beams 15 to 18, fifth to eighth detection frames 25 to 28, fifth to eighth link beams 35 to 38, fifth to eighth detection electrodes 45 to 48, and anchors 95 to 98, respectively.

Fifth and seventh detection frames 25 and 27 are rotatable about third torsion axis T3. Sixth and eighth detection frames 26 and 28 are rotatable about fourth torsion axis T4. Third and fourth torsion axes T3 and T4 are located at positions rotated by 90 degrees with respect to first and second torsion axes T1 and T2.

Fifth and sixth axes L5 and L6 on which fifth and sixth link beams 35 and 36 are connected to fifth and sixth detection frames 25 and 26 are located at positions shifted from positions of third and fourth torsion axes T3 and T4 in the same direction. That is, offsets e5 and e6 are equal.

Seventh and eighth axes L7 and L8 on which seventh and eighth link beams 37 and 38 are connected to seventh and eighth detection frames 27 and 28 are located at positions that are shifted from the positions of third and fourth torsion axes T3 and T4 in the same direction, which is opposite to the direction of shift of fifth and sixth axes L5 and L6. That is, offsets e7 and e8 are equal, the direction of offsets e7 and e8 is opposite to the direction of offsets e5 and e6, and the absolute values thereof are equal.

Since the constitution other than this in the present embodiment is the same as the constitution of Embodiment 2 described above, the same components will be denoted by the same reference numerals and characters, and the explanation of the components will not be repeated.

As has been described above, according to the present embodiment, the acceleration sensor further includes fifth to eighth detection frames 25 to 28, fifth to eighth torsion beams 15 to 18, and fifth to eighth link beams 35 to 38 implemented by rotating first and second detection frames 21 and 22, first and second torsion beams 11 and 12, and first and second link beams 31 and 32 by 90 degrees, respectively. Thereby, the acceleration sensor can deal with warpage even when substrate 1 is warped in any of the X axis and Y axis directions. Therefore, it is possible to detect output further accurately.

It should be understood that the embodiments and examples disclosed herein are illustrative and non-restrictive in every respect. The scope of the present invention is defined by the scope of the claims, rather than the embodiments described above, and is intended to include any modifications within the scope and meaning equivalent to the scope of the claims.

INDUSTRIAL APPLICABILITY

The present invention is particularly advantageously applicable to an electrostatic capacitance type acceleration sensor.

The invention claimed is:

1. An acceleration sensor, comprising:
   a substrate;
   a first torsion beam supported by said substrate to be distorted around a first torsion axis;
   a first detection frame supported by said substrate via said first torsion beam so as to be rotatable about said first torsion axis;
   a second torsion beam supported by said substrate to be distorted around a second torsion axis;
   a second detection frame supported by said substrate via said second torsion beam so as to be rotatable about said second torsion axis;
   first and second detection electrodes formed on said substrate so as to face said first and second detection frames, respectively, for detecting an angle formed between said substrate and each of said first and second detection frames on the basis of electrostatic capacitance;
   a first link beam connected to said first detection frame on a first axis located at a position shifted from a position of said first torsion axis to one end side of said first detection frame along a direction crossing said first torsion axis;
   a second link beam connected to said second detection frame on a second axis located at a position shifted from a position of said second torsion axis in a direction identical to the direction of shift from the position of said first torsion axis; and
   an inertia mass body supported above said substrate to be displaceable in a thickness direction of said substrate, by being linked with said first and second detection frames by said first and second link beams, respectively.

2. The acceleration sensor according to claim 1, wherein an offset between said first torsion axis and said first link beam is equal to an offset between said second torsion axis and said second link beam.

3. The acceleration sensor according to claim 1, wherein said first torsion axis and said second torsion axis are in parallel with each other.

4. The acceleration sensor according to claim 1, wherein said first and second detection frames, said first and second torsion beams, and said first and second link beams are disposed to be symmetrical with respect to an axis in parallel with said first and second torsion axes.

5. The acceleration sensor according to claim 4, wherein said first and second detection frames, said first and second torsion beams, and said first and second link beams are disposed to be symmetrical with respect to an axis crossing said first and second torsion axes.

6. The acceleration sensor according to claim 5, further comprising detection frames, torsion beams, and link beams implemented by rotating said first and second detection frames, said first and second torsion beams, and said first and second link beams by 90 degrees, respectively.

7. The acceleration sensor according to claim 1, further comprising:
   a third torsion beam supported by said substrate to be distorted around a third torsion axis;
   a third detection frame supported by said substrate via said third torsion beam so as to be rotatable about said third torsion axis;
   a fourth torsion beam supported by said substrate to be distorted around a fourth torsion axis;
   a fourth detection frame supported by said substrate via said fourth torsion beam so as to be rotatable about said fourth torsion axis;
   third and fourth detection electrodes formed on said substrate so as to face said third and fourth detection frames, respectively, for detecting an angle formed between said substrate and each of said third and fourth detection frames on the basis of electrostatic capacitance;
   a third link beam connected to said third detection frame on a third axis located at a position shifted from a position of said third torsion axis to one end side of said third detection frame along a direction crossing said third torsion axis; and a fourth link beam connected to said fourth detection frame on a fourth axis located at a position shifted from a position of said fourth torsion axis in a direction identical to the direction of shift from the position of said third torsion axis, wherein a direction of shift from said third and fourth torsion axes to said third and fourth axes is opposite to a direction of shift from said first and second torsion axes to said first and second axes.

* * * * *